United States Patent
Oyamada et al.

(10) Patent No.: US 10,149,379 B2
(45) Date of Patent: Dec. 4, 2018

(54) MULTI-LAYERED CIRCUIT BOARD AND SEMICONDUCTOR DEVICE

(71) Applicant: Noda Screen Co., Ltd., Aichi (JP)

(72) Inventors: Seisei Oyamada, Komaki (JP); Masamitsu Yoshizawa, Komaki (JP); Hirotaka Ogawa

(73) Assignee: NODA SCREEN CO., LTD., Aichi (JP)

( * ) Notice: Subject to any disclaimer, the term of this patent is extended or adjusted under 35 U.S.C. 154(b) by 119 days.

(21) Appl. No.: 15/030,479

(22) PCT Filed: Oct. 17, 2014

(86) PCT No.: PCT/JP2014/077701
§ 371 (c)(1),
(2) Date: Apr. 19, 2016

(87) PCT Pub. No.: WO2015/060216
PCT Pub. Date: Apr. 30, 2015

(65) Prior Publication Data
US 2016/0262260 A1    Sep. 8, 2016

(30) Foreign Application Priority Data

Oct. 21, 2013  (JP) ................. 2013-218138

(51) Int. Cl.
*H05K 1/18* (2006.01)
*H05K 1/02* (2006.01)
(Continued)

(52) U.S. Cl.
CPC ..... *H05K 1/0231* (2013.01); *H01L 23/49822* (2013.01); *H01L 23/49838* (2013.01);
(Continued)

(58) Field of Classification Search
CPC ......... H01L 2224/131; H01L 2924/014; H01L 2224/16227; H01L 2224/16235;
(Continued)

(56) References Cited

U.S. PATENT DOCUMENTS

| 6,764,931 B2 | 7/2004 | Iijima et al. |
| 6,884,655 B2 | 4/2005 | Iijima et al. |

(Continued)

FOREIGN PATENT DOCUMENTS

| JP | 2003-068923 | 3/2003 |
| JP | 2005-210074 | 8/2005 |

(Continued)

OTHER PUBLICATIONS

International Search Report dated Nov. 11, 2014 in International (PCT) Application No. PCT/JP2014/077701 with English translation.

*Primary Examiner* — Yuriy Semenenko
(74) *Attorney, Agent, or Firm* — Wenderoth, Lind & Ponack, L.L.P.

(57) ABSTRACT

A multi-layered circuit board includes a first insulating layer, a second insulating layer, and a sheet capacitor that is located between the first insulating layer and the second insulating layer. The sheet capacitor includes a pair of electrodes that sandwich a dielectric. Lead wirings continue to the electrodes, respectively. The lead wirings are disposed on an opposite side of the first or the second insulating layer with respect to the sheet capacitor to overlap the electrodes when viewed from a stacking direction of the multi-layered circuit board. Because the lead wirings are arranged to overlap the electrodes in the stacking direction of the multi-layered circuit board, an ESL of the sheet capacitor is maintained low.

6 Claims, 15 Drawing Sheets

(51) Int. Cl.
*H05K 1/16* (2006.01)
*H01L 23/498* (2006.01)
*H01L 23/00* (2006.01)
*H05K 1/11* (2006.01)

(52) U.S. Cl.
CPC ........... *H01L 24/17* (2013.01); *H05K 1/0298* (2013.01); *H05K 1/11* (2013.01); *H05K 1/113* (2013.01); *H05K 1/162* (2013.01); *H05K 1/181* (2013.01); *H05K 1/185* (2013.01); *H01L 23/49816* (2013.01); *H01L 23/49827* (2013.01); *H01L 24/13* (2013.01); *H01L 24/16* (2013.01); *H01L 2224/131* (2013.01); *H01L 2224/16227* (2013.01); *H01L 2224/16235* (2013.01); *H01L 2924/15311* (2013.01); *H01L 2924/15747* (2013.01); *H01L 2924/19011* (2013.01); *H01L 2924/19041* (2013.01); *H05K 2201/09672* (2013.01)

(58) Field of Classification Search
CPC ......... H01L 23/49816; H01L 23/49822; H01L 23/49827; H01L 23/49838; H01L 24/13; H01L 24/16; H01L 24/17; H01L 2924/15311; H01L 2924/15
See application file for complete search history.

(56) References Cited

U.S. PATENT DOCUMENTS

| | | | | |
|---|---|---|---|---|
| 7,175,249 | B2* | 2/2007 | Hongo | B41J 29/38 347/19 |
| 7,594,105 | B2* | 9/2009 | Ohsaka | G06F 1/188 29/825 |
| 7,821,795 | B2 | 10/2010 | Sugaya et al. | |
| 2003/0049885 | A1* | 3/2003 | Iijima | H01L 21/4857 438/106 |
| 2004/0209398 | A1 | 10/2004 | Iijima et al. | |
| 2005/0092520 | A1* | 5/2005 | Chao | H05K 1/0225 174/260 |
| 2007/0144770 | A1* | 6/2007 | Nakao | H05K 1/0225 174/260 |
| 2007/0242440 | A1 | 10/2007 | Sugaya et al. | |
| 2014/0247574 | A1* | 9/2014 | Tamaki | H05K 1/0225 361/772 |

FOREIGN PATENT DOCUMENTS

| | | |
|---|---|---|
| JP | 2007-165814 | 6/2007 |
| JP | 2011-146454 | 7/2011 |
| JP | 2013-030528 | 2/2013 |
| JP | 2013-140952 | 7/2013 |
| WO | 2006/082838 | 8/2006 |

* cited by examiner

MULTI-LAYERED CIRCUIT BOARD AND SEMICONDUCTOR DEVICE

TECHNICAL FIELD

The present invention relates to a multi-layered circuit board including capacitors and a semiconductor device

BACKGROUND ART

A multi-layered circuit board is produced by stacking insulating layers on surfaces of which wiring patterns are formed with copper foils or other materials. When the multi-layered circuit board is used as a mounting board for mounting electronic components thereon such as semiconductor chips, a capacitor that functions as a bypass capacitor may be included in the multi-layered circuit board. An equivalent series inductance (ESL) of such a capacitor increases proportional to a length of wiring between the capacitor and the electronic component. As a result, high-frequency characteristics of the multi-layered circuit board degrade. A technology to resolve such a problem by enclosing the capacitor between insulating layers and arranging the capacitor adjacent to the electronic component has been known.

RELATED ART DOCUMENT

Patent Document

Patent Document 1: Japanese Unexamined Patent Application Publication No. 2007-165814

Problem to be Solved by the Invention

Even if the capacitor is prepared in a form of a sheet capacitor and embedded in the multi-layered circuit board, the sheet capacitor may not be arranged adjacent to the electronic component due to a limitation of arrangement of the sheet capacitor. Therefore, the wiring may not be shortened as expected. There is a demand for a technology to suppress the ESL of the sheet capacitor other than by shortening the wiring.

Disclosure of the Present Invention

The technology disclosed in this description was made in view of the above circumstances. An object is to suppress an ESL of a sheet capacitor included in a multi-layered circuit board and a semiconductor device.

Means for Solving the Problem

A multi-layered circuit board disclosed in this description includes a first insulating layer, a second insulating layer, a sheet capacitor, and lead wirings. The sheet capacitor is disposed between the first insulating layer and the second insulating layer. The sheet capacitor includes a pair of electrodes and a dielectric that is sandwiched between the electrodes. The lead wirings are connected to the electrodes, respectively. The lead wirings are disposed on an opposite side of the first or the second insulating layer with respect to the sheet capacitor to overlap the electrodes when viewed from a stacking direction of the multi-layered circuit board.

In the multi-layered circuit board, the lead wirings are disposed so as to overlap the electrodes of the sheet capacitor in the stacking direction of the multi-layered circuit board. According to the configuration, a magnetic field generated by a current that flows through the lead wiring and a magnetic field generated by a current that flows through portions of the electrodes opposed to the lead wiring cancel each other and thus an ESL of the sheet capacitor is reduced.

In the multi-layered circuit board, the lead wirings may be connected to tabs of the electrodes. The tabs may project outward from opposed portions of the respective electrodes opposed to the dielectric in a direction along a plate surface of the multi-layered circuit board.

In the configuration in which the electrodes of the sheet capacitor include the tabs that project outward, currents flow in and out of the electrodes through the tabs. In a conventional multi-layered circuit board, lead wirings are not overlapped with electrodes. Therefore, in the case of the conventional multi-layered circuit board, a current tends to flow along an outer edge of an electrode between tabs in a high frequency range. The concentration of the current, that is, a narrowed current path may result in increase in equivalent series resistance (ESR) of a sheet capacitor. In comparison to such a conventional configuration, the currents flow in large areas of the electrodes in the multi-layered circuit board according to the present invention because the magnetic fields cancel each other. Therefore, the ESR of the sheet capacitor decreases in comparison to the conventional configuration.

In the multi-layered circuit board according to the present invention, the lead wirings may continue to board-side connecting pads, respectively. The board-side connecting pads may be formed on one of surfaces of the multi-layered circuit board, connected to chip-side connecting pads in a power supply system of a semiconductor chip on the multi-layered circuit board. The board-side connecting pads may be disposed to overlap the electrodes when viewed from the stacking direction of the multi-layered circuit board.

According to the multi-layered circuit board, the ESL of the sheet capacitor that functions as a bypass capacitor of the semiconductor chip on the multi-layered circuit board can be reduced. Furthermore, with the board-side connecting pads disposed at positions that overlap the sheet capacitor in the stacking direction of the multi-layered circuit board, the ESL of the sheet capacitor due to the lead wiring is less likely to increase.

The multi-layered circuit board may include a plurality of the lead wirings continuing from the corresponding board-side connecting pad to different portions of the corresponding plate electrode.

According to the multi-layered circuit board, currents are distributed from multiple portions to the electrodes of the sheet capacitor. In comparison to a configuration in which the current is supplied only from one portion, the ESR of the sheet capacitor decreases.

A semiconductor device disclosed in this specification includes a circuit board, a semiconductor chip, and a sheet capacitor. The semiconductor chip is mounted on the circuit board using a flip chip technology. The semiconductor chip includes a heat generating region and a pair of power supply wirings. Heat is generated in the heat generating region when power is supplied to the heat generating region. The pair of power supply wirings is for supplying power to the heat generating region. The sheet capacitor includes a pair of plate electrodes and a dielectric film that is sandwiched between the plate electrodes. The sheet capacitor is included in the circuit board or the semiconductor chip. The plate electrodes are disposed to overlap the pair of power supply wirings of the semiconductor chip when viewed from a stacking direction in which the dielectric film and the pair of the plate electrodes are stacked.

In the semiconductor device, the pair of plate electrodes of the sheet capacitor is disposed to overlap the pair of power supply ones of the semiconductor chip when viewed from a stacking direction in which the dielectric film and the pair of the plate electrodes are stacked. According to the configuration, a magnetic field generated by currents that flow through the power supply wirings and a magnetic field generated by currents that flow through portions of the plate electrodes opposed to the power supply wirings cancel each other. Therefore, the ESL of the sheet capacitor relative to the heat generating area decreases.

In the semiconductor device, the heat generating region may be located at a position that overlaps the pair of the plate electrodes when viewed from the stacking direction.

According to the configuration, about entire areas of the power supply wirings extending to the heat generating area are opposed to the sheet capacitor. In comparison to a configuration in which a heat generating region is not located at a position that overlaps the pair of electrodes, the ESL of the sheet capacitor relative to the heat generating region decreases. Therefore, noises produced in the heat generating region decrease.

The heat generating region may be a region in which heat is generated at a highest temperature in the semiconductor chip.

In the semiconductor device, the region in which the heat is generated at the highest temperature is a region in which switching of transistors included in the semiconductor device actively occurs at high intensity and thus high power consumption occurs. In such a region, noises are most likely to occur. Therefore, noise reduction effect by the sheet capacitor is highly expected.

Advantageous Effect of the Invention

According to the present invention, an ESL of a capacitor component including lead wirings is maintained low because magnetic field generated by a current is canceled.

MODE FOR CARRYING OUT THE INVENTION

<First Embodiment>

A first embodiment of the present invention will be described with reference to FIGS. 1 to 18.

Figure 1:
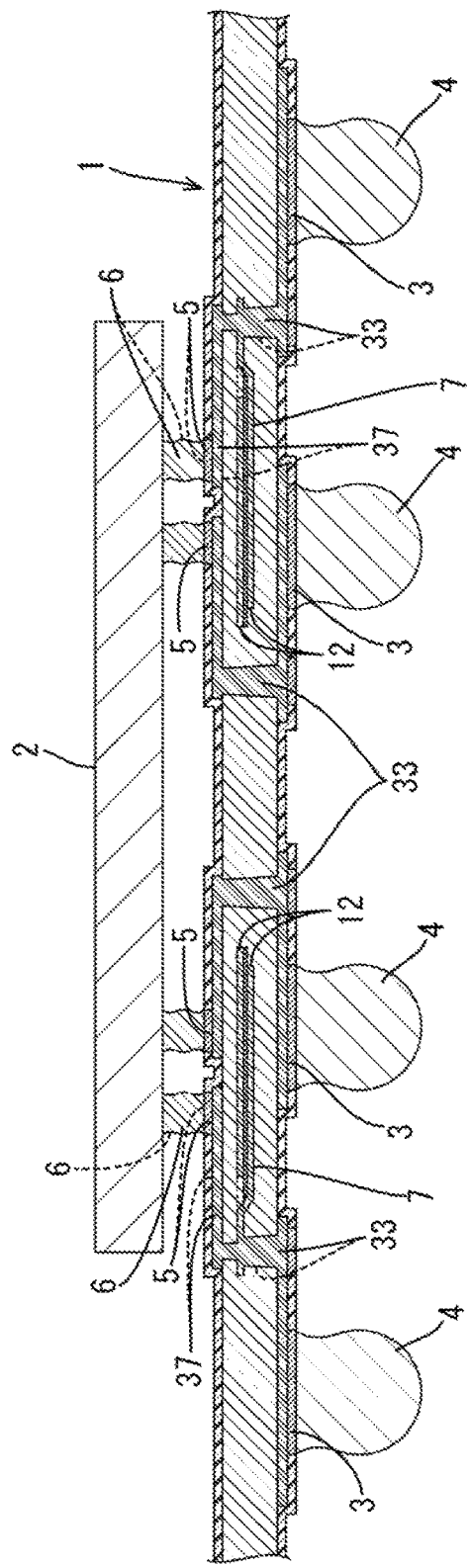
FIG. 1 is a cross-sectional view of an LSI package including a multi-layered circuit board.

A package including an LSI 2 and a multi-layered circuit board 1 that is used as a relay board according to the first embodiment is illustrated in FIG. 1. External connection pads 3 are formed on a lower surface of the multi-layered circuit board 1. Solder balls 4 for external connection are formed on the external connection pads 3. Chip connecting pads 5 are formed on an upper surface of the multi-layered circuit board 1 at positions corresponding to pads of the LSI 2, which are not illustrated. The multi-layered circuit board 1 is connected to the LSI 2 with micro solder balls 6 formed on the chip connecting pads 5. The multi-layered circuit board 1 includes sheet capacitors 7 therein. The sheet capacitors 7 are located between multiple pairs of power supply terminals and ground terminals of the LSI 2. The sheet capacitors 7 function as bypass capacitors. The chip connecting pads 5 are an example of a board-side connecting pad.

Figure 2:
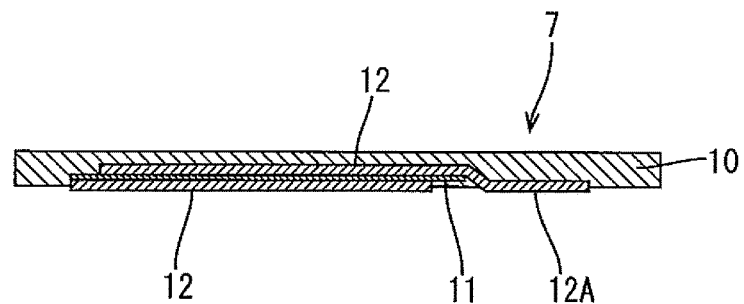
FIG. 2 is a cross-sectional view of a sheet capacitor.
Figure 3:
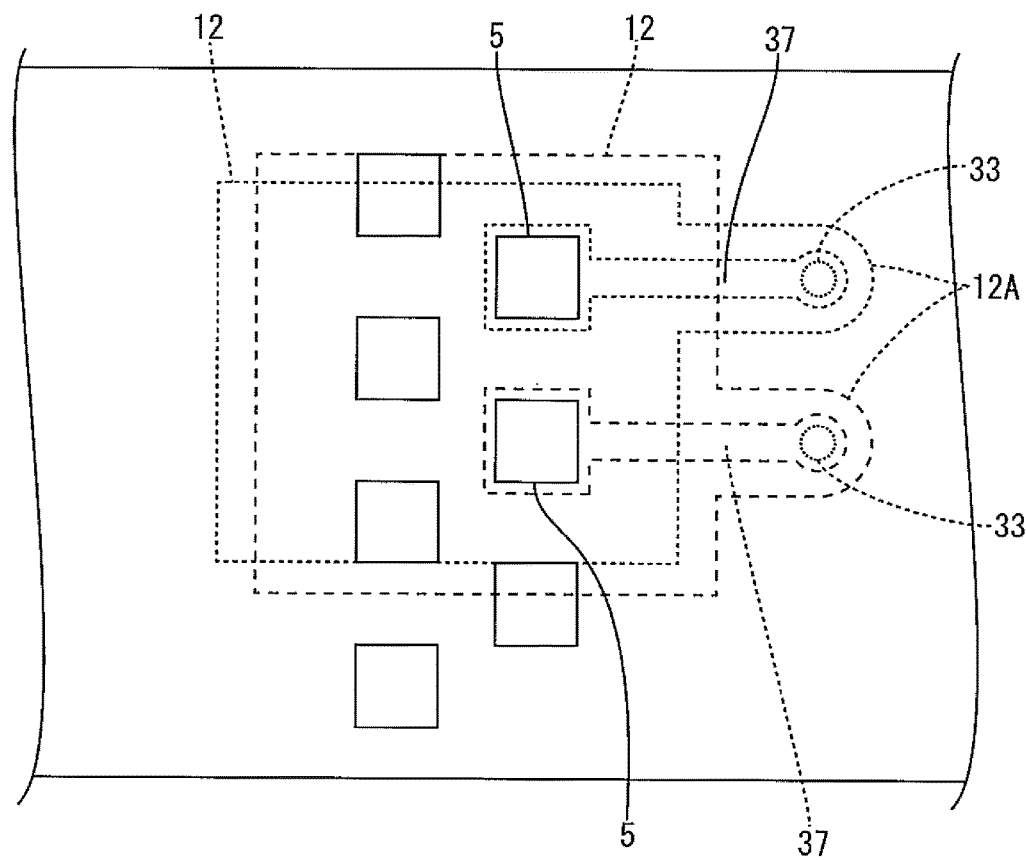
FIG. 3 is a magnified cross-sectional view of the sheet capacitor.

The multi-layered circuit board 1 is produced as follows. First, the sheet capacitors 7 are prepared. As illustrated in FIG. 2, each sheet capacitor 7 is formed on a surface of an insulating substrate 10, and includes a dielectric layer 11 and a pair of plate electrodes 12. The insulating substrate 10 has a thickness of about 30 µm. The dielectric layer 11 is between the plate electrodes 12 that are layered on the surface of the insulating substrate 10. One of the plate electrodes 12 is formed from a metal thin film such as a copper thin film in thickness of some micro meters and in a rectangular form on the surface of the insulating substrate 10. As illustrated in FIG. 3, the plate electrodes 12 include tabs 12A at outer edges, respectively. The dielectric layer 11 is prepared by forming paraelectrics such as strontium titanate on one of the plate electrodes 12 in a thickness of some-hundred nanometers by the CVD method or the aerosol CVD method. The dielectric layer 11 is an example of a dielectric. The other one of the plate electrodes 12 is formed over the dielectric layer 11 by the same method as the one of the plate electrodes 12 described above. Although the tabs 12A of the plate electrodes 12 are located at the same side of the plate electrodes 12 in this embodiment, the tabs 12A may be formed at opposite sides of plate electrodes 12.

Figure 4:
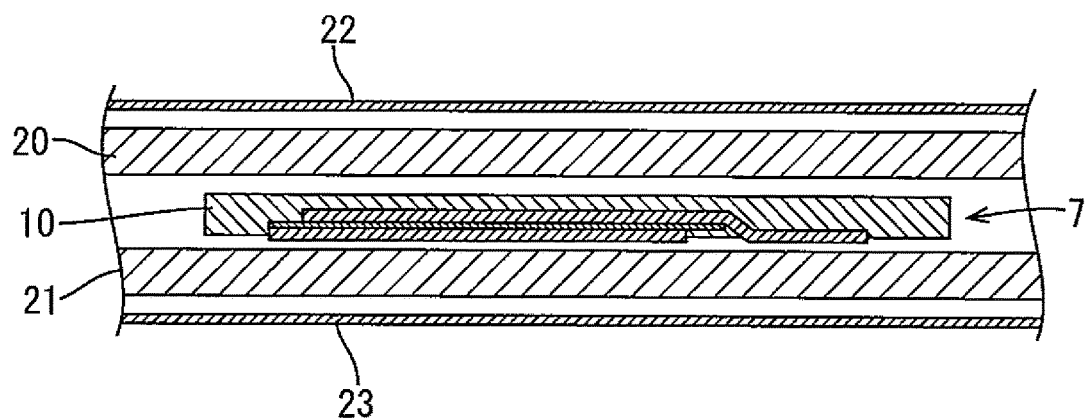
FIG. 4 is a cross-sectional view illustrating a stacking process.
Figure 5:
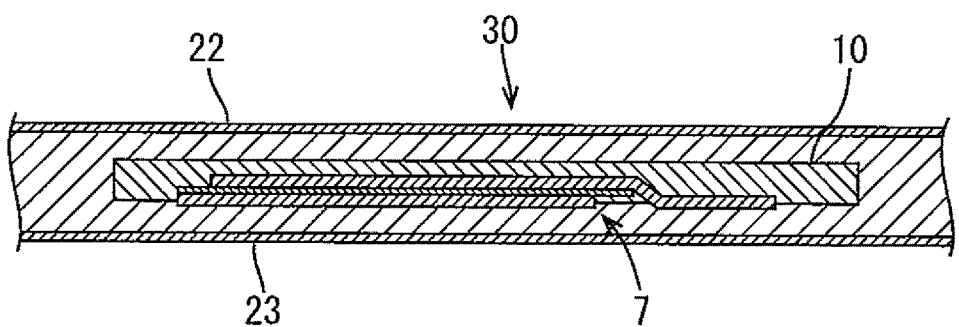
FIG. 5 is a cross-sectional view of a double-sided copper-clad laminate.

As illustrated in FIG. 4, the insulating substrate 10 on which the sheet capacitor 7 is formed is sandwiched between prepreg sheets 20 and 21 in a top-bottom direction. The prepreg sheets 20 and 21 are in the B stage. Copper foils 22 and 23 are stacked on the prepreg sheets 20 and 21, respectively. The prepreg sheets 20 and 21 and the copper foils 22 and 23 are heat pressed to the insulating substrate under vacuum. As a result, the prepreg sheets 20 and 21 are hardened and a double-sided copper-clad laminate 30 including the sheet capacitors 7 (see FIG. 5) is prepared. The prepreg sheets 20 and 21 are examples of a first insulating layer and a second insulating layer. Tops and bottoms of FIGS. 2 and 4 through 13 are inverted from those of FIG. 1.

The double-sided copper-clad laminate 30 prepared as described above includes conductive circuits in three layers when the plate electrodes 12 of the sheet capacitor 7 are considered as one layer. Namely, the conductive circuit is formed of three layers including the upper copper foil 22, the lower copper foil 23, and the plate electrodes 12. Next, a method of forming interlayer connecting structures for connecting the conductive circuits will be described.

Figure 6:
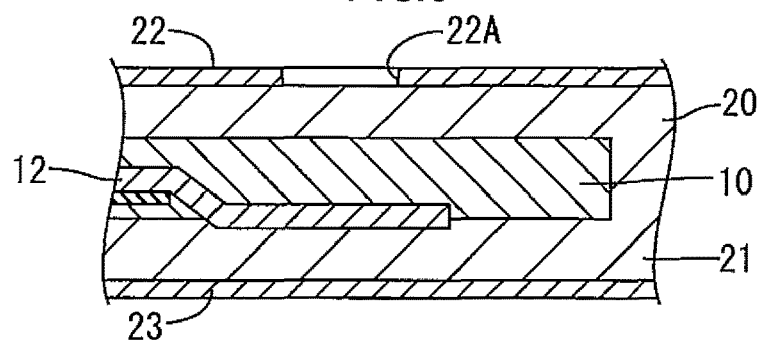
FIG. 6 is a magnified cross-sectional view illustrating a forming step of an interlayer connecting conductor.
Figure 7:
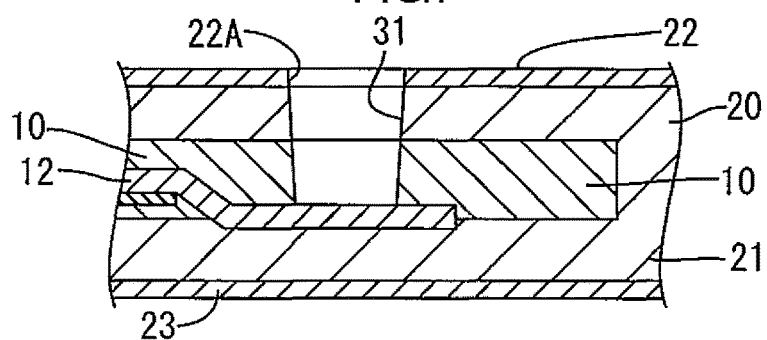
FIG. 7 is a magnified cross-sectional view with a large-diameter via.

First, a hole 22A is formed in the upper copper foil 22 by applying an ultraviolet laser beam thereto (see FIG. 6). The reason why the ultraviolet is used is that a proper hole cannot be formed by a regular carbon dioxide laser beam to form the hole in the copper foil 22 because the carbon dioxide laser beam does not have sufficient wavelength and energy level. Next, the carbon dioxide laser beam is applied to the upper prepreg sheet 20 and the insulating substrate 10 of the sheet capacitor 7 through the hole 22A to remove portions of those and form a large-diameter via 31 having a diameter of about 160 μm. Although the carbon dioxide laser beam may be the first option for removing organic materials, it cannot penetrate the plate electrode 12. As illustrated in FIG. 7, a portion of the plate electrode 12 is exposed at the bottom of the large-diameter via 31.

Figure 8:
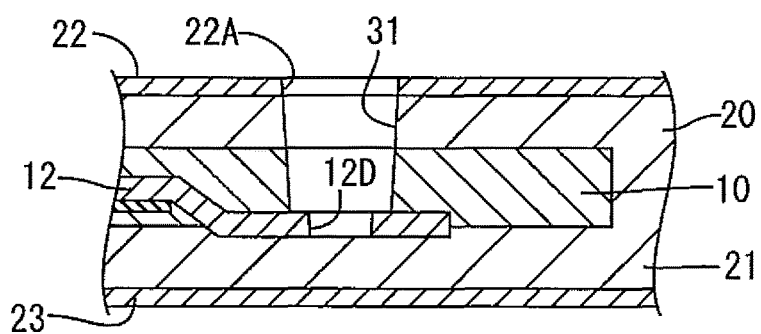
FIG. 8 is a magnified cross-sectional view illustrating a step of forming a hole in the conductor.
Figure 9:
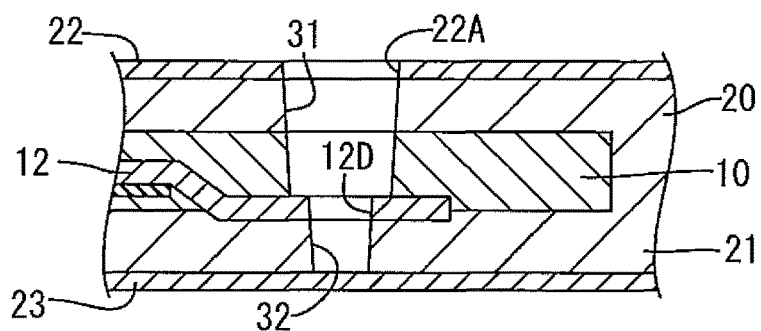
FIG. 9 is a magnified cross-sectional view with a small-diameter via.

Next, the ultraviolet laser beam with a reduced spot diameter is irradiated toward the bottom of the large-diameter via 31. Because the ultraviolet laser beam has a wavelength and an energy level sufficient for removing the plate electrode 12 exposed at the bottom of the large-diameter via 31, a small opening 12D having a diameter of about 60 μm is formed in the plate electrode 12 as illustrated in FIG. 8. Then, the carbon dioxide laser beam is applied to the lower prepreg sheet 21 through the small opening 12D. As a result, a portion of the prepreg sheet 21 is removed and a small-diameter via 32 is formed in the prepreg sheet 21 as illustrated in FIG. 9. The small-diameter via 32 communicates with the large-diameter via 31 through the small opening 12D formed in the tab 12A of the plate electrode 12. The diameters of the small opening 12D formed in the tab 12A of the plate electrode 12 and the small-diameter via 32 are smaller than the diameter of the large-diameter via 31. Therefore, a portion of the copper foil 23 is exposed at the bottom of the large-diameter via 31. After the steps of applying the laser beams, desmear steps or necessary steps are performed although they will not be described in detail.

Figure 10:
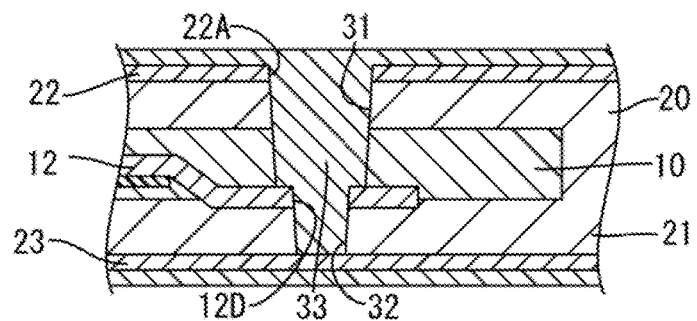
FIG. 10 is a magnified cross-sectional view illustrating a forming step of an interlayer connecting conductor.
Figure 11:
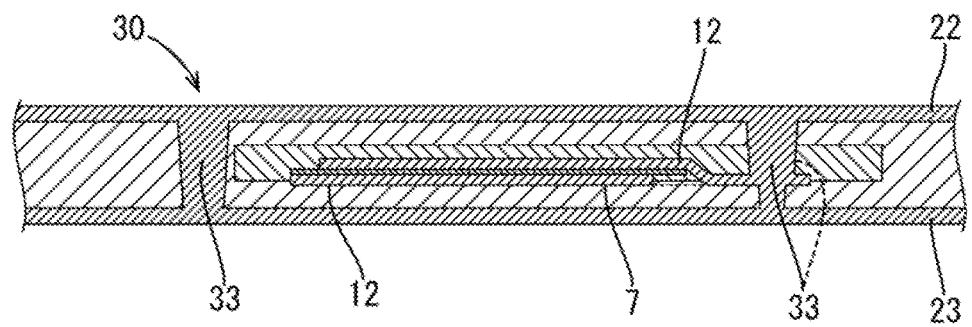
FIG. 11 is a cross-sectional view after plating

Then, plating is performed on the double-sided copper-clad laminate 30 in which the vias 31 and 32 having different diameters are formed and the large-diameter via 31 and the small-diameter via 32 are filled with a plating metal as illustrated in FIG. 10. Through the above process, an interlayer connecting conductor 33 for electrically connecting the three layers of the conductive circuit including the copper foil 22, the tab 12A of the plate electrode 12 of the sheet capacitor 7, and the copper foil 23 together is formed.

For the sake of simplification, FIGS. 6 through 10 only illustrate the steps of forming the interlayer connecting conductor 33 connected to one of the plate electrodes 12 of the sheet capacitor 7. However, the interlayer connecting conductors 33 connected to respectively each plate electrode 12 are also formed for all of the sheet capacitors 7. In the drawings used in the following description, plating layers formed in the interlayer connecting process, the copper foils 22 and 23 and the plate electrodes 12 are illustrated as a single layer for simplification of the drawings.

Figure 12:
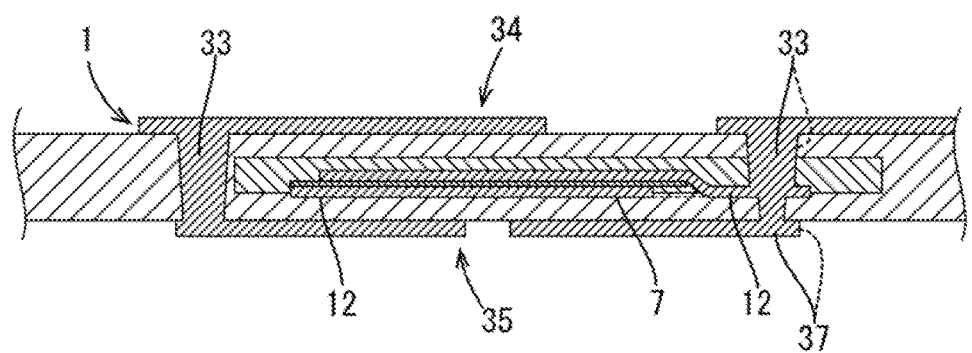
FIG. 12 is a cross-sectional view with a double-sided circuit.
Figure 13:
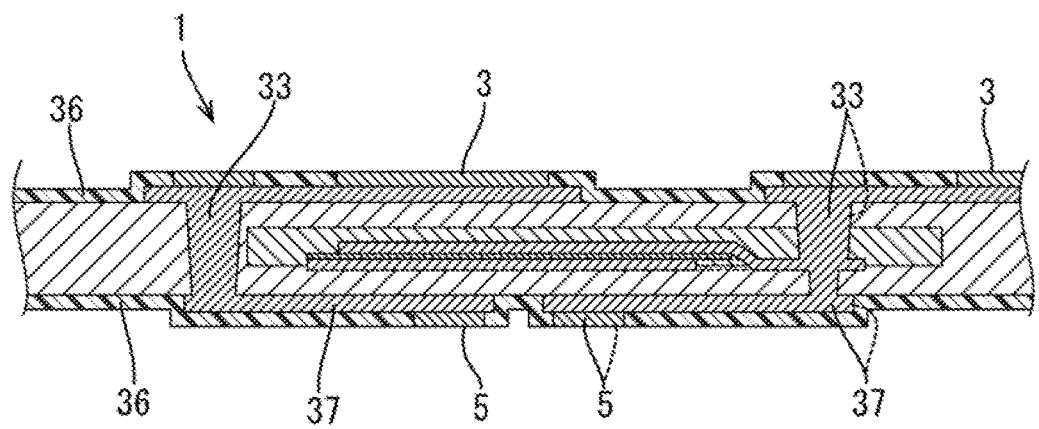
FIG. 13 is a cross-sectional view with solder resists.

Designed circuits are formed on the copper foils 22 and 23 that are outer most layers by a known print wiring method. As a result, conductive circuits 34 and 35 are formed on an upper side and a lower side, respectively, as illustrated in FIG. 12. As illustrated in FIG. 13, external connection pads 3 and chip connecting pads 5 are formed in appropriate portions of the conductive circuits 34 and 35. In the conductive circuit 35, a lead wiring 37 for connecting the chip connecting pad 5 to the interlayer connecting conductor 33 is formed from the remaining copper foil 23. Furthermore, solder resists 36 are formed in appropriate portions. Through the above process, the multi-layered circuit board 1 is prepared.

The lead wiring 37 is arranged on an upper surface of the multi-layered circuit board 1, that is, on a surface farther from the sheet capacitor 7 of the prepreg sheet 21. As illustrated in FIG. 3, the lead wiring 37 overlaps the plate electrodes 12 of the sheet capacitor 7 when viewed from a stacking direction of the multi-layered circuit board 1.

Each chip connecting pad 5 is formed on the lead wiring 37 of the conductive circuit 35, specifically, on portions of the lead wiring 37 overlapping portions of the plate electrodes 12 other than the tab 12A. Each lead wiring 37 connects the corresponding chip connecting pad 5 and the corresponding interlayer connecting conductor 33 so as to linearly extend on the upper portion of the multi-layered circuit board 1. Each lead wiring 37 is connected to the plate electrodes 12 via the interlayer connecting conductor 33.

Figure 14:
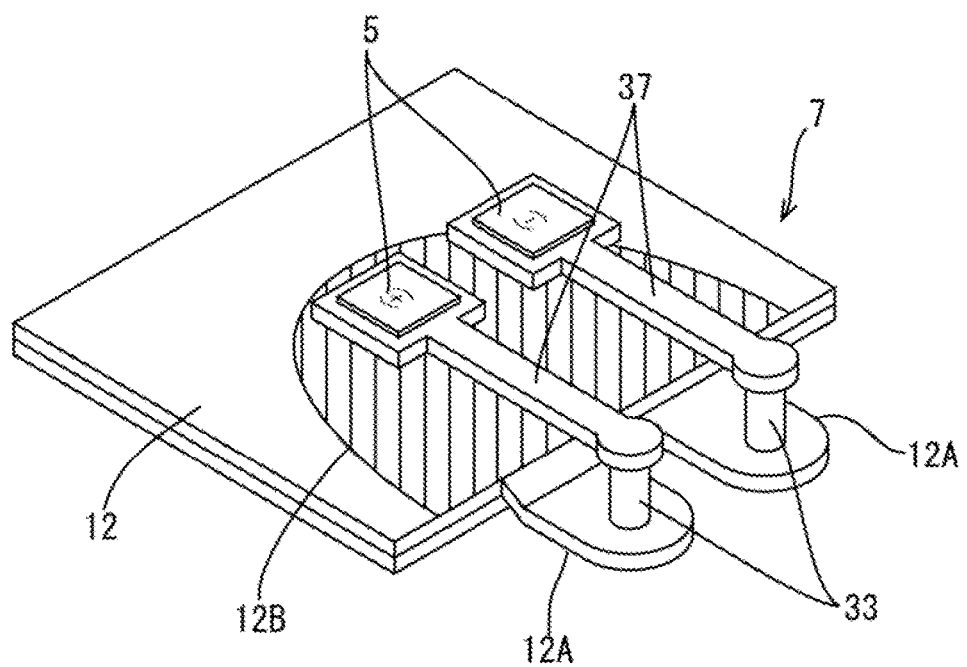
FIG. 14 is a perspective view of a return-type capacitor.

The chip connecting pads 5, the sheet capacitor 7, the interlayer connecting conductors 33, and the lead wirings 37 are illustrated extracted from the multi-layer circuit board 1 in FIG. 14. A current generated by electric charge supplied to the sheet capacitor 7 through the chip connecting pad 5 flows through the lead wiring 37 from a point that overlaps the plate electrode 12 to a point that overlaps the tab 12A and then back to the plate electrode 12. Namely, in the multi-layered circuit board 1, so to speak, a return-type capacitor is formed, that has a current path through which the current flows back. The current path is formed by the chip connecting pad 5, the sheet capacitor 7, the corresponding interlayer connecting conductor 33, and the corresponding lead wiring 37.

In the return-type capacitor, when viewed from the stacking direction of the multi-layered circuit board 1, each lead wiring 37 is arranged to overlap the corresponding plate electrode 12 of the sheet capacitor 7 via a very thin insulating layer. Therefore, a magnetic field generated by the current that flows through the lead wiring 37 may affect current distributions of an opposed portion 12B of the plate electrode 12 opposed to the lead wiring 37. Because the current flows in and out of the plate electrode 12 via the tab 12A, there is a current distribution from the tab 12A to the middle of the plate electrode 12. The direction in which the current flows is opposite to a direction in which the current that flows through the lead wiring 37 opposed to the plate electrode 12. Therefore, a magnetic field generated by the current that flows through the lead wiring 37 and the magnetic field generated by the current that flows through the plate electrode 12 cancel each other. As a result, a self-inductance of a conductive path defined according to an intensity of a magnetic field decreases.

Figure 15:
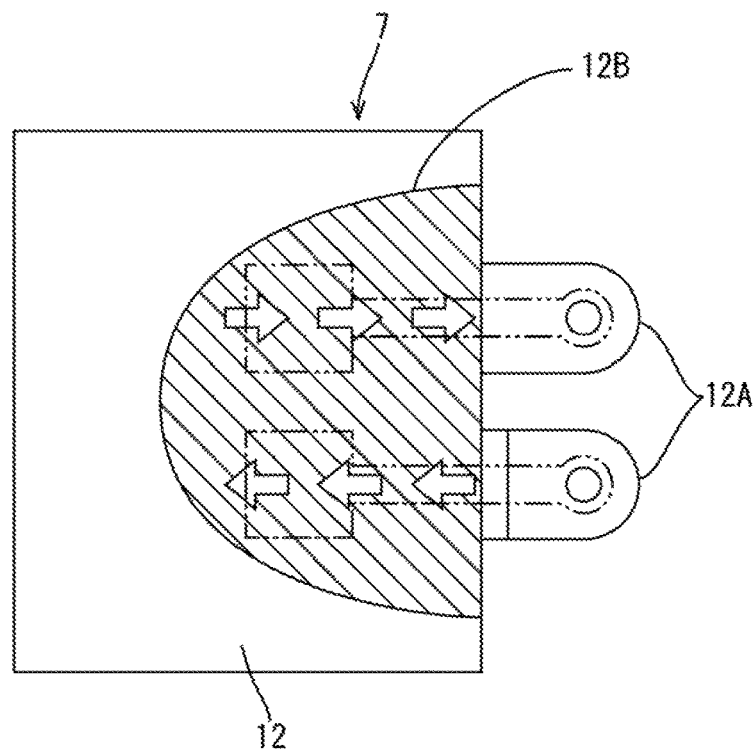
FIG. 15 is a view illustrating a flow of current through electrodes of the return-type capacitor.

Results of a simulation using a three-dimensional electromagnetic field simulator program by the finite element method show a tendency of the distribution of the current that flows through the opposed portion 12B of the plate electrode 12 in the direction opposite to the direction in which the current flows through the lead wiring 37 opposed to the opposed portion 12B to increase in the return-type capacitor as indicated with arrows in FIG. 15. This may be because the magnetic field generated by the current that flows through the lead wiring 37 and the magnetic field generated by the current that flows through the opposed portion 12B of the plate electrode 12 cancel each other since the current flows through the opposed portion 12B of the plate electrode 12 in the direction opposite to the direction in which the current flows through the lead wiring 37 and thus the inductance component of the sheet capacitor 7 is kept low.

Figure 16:
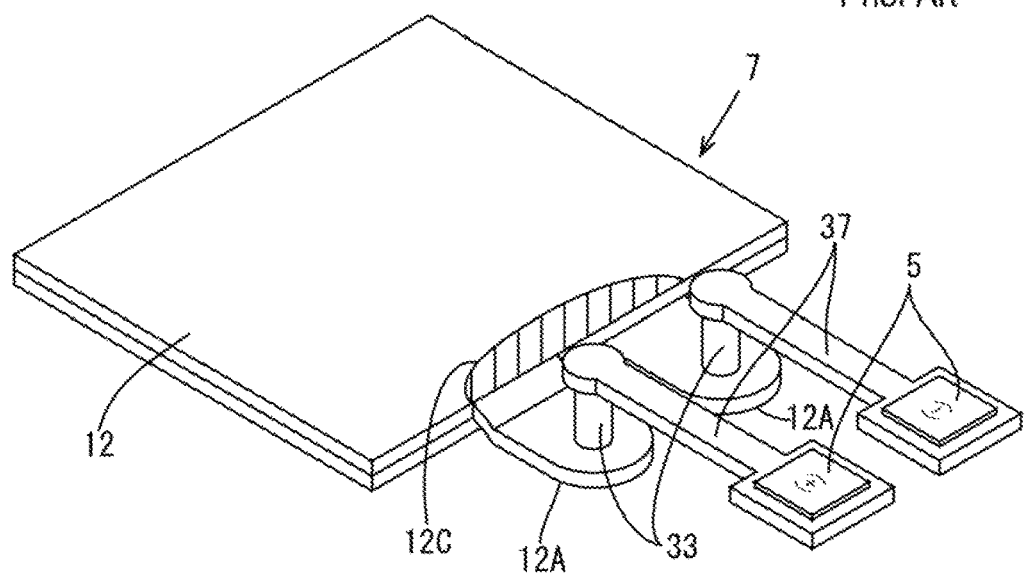
FIG. 16 is a perspective view of a conventional capacitor.

A similar simulation was performed on a conventional capacitor that is not a return-type capacitor (see FIG. 16). As illustrated in FIG. 16, in the conventional capacitor, lead wirings 37 do not overlap portions of plate electrodes 12 of the sheet capacitor 7 other than tabs 12A. A capacitance of the conventional capacitor is equal to the capacitance of the capacitor illustrated in FIG. 14.

Figure 17:
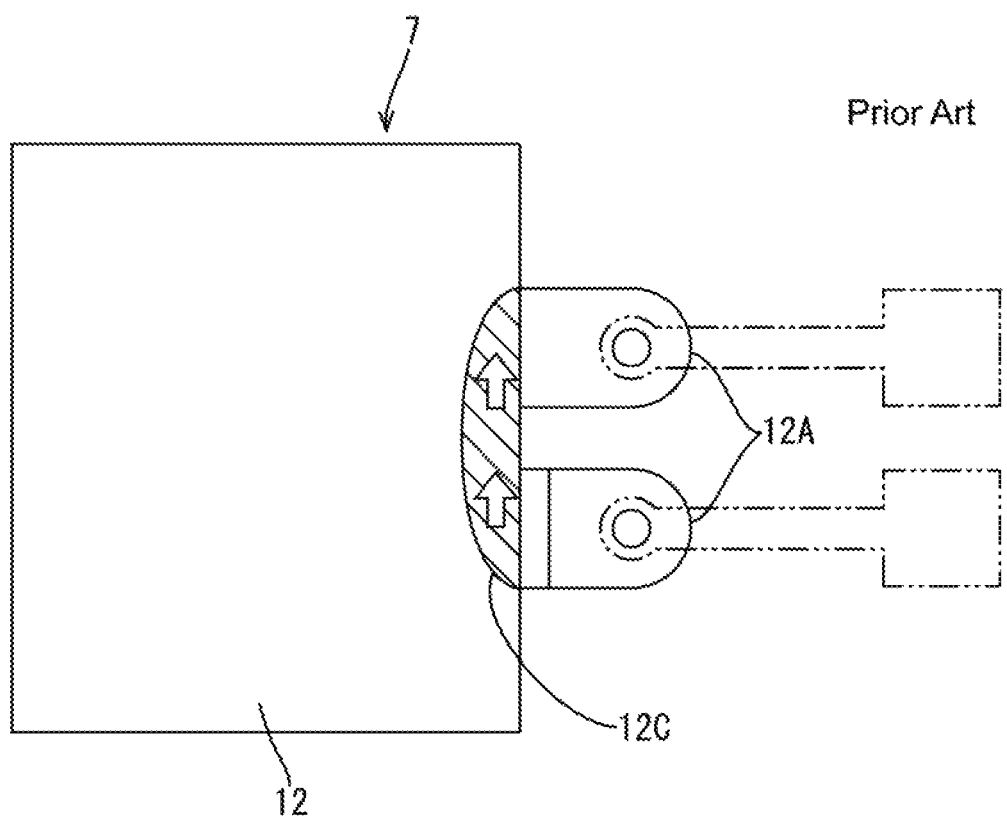
FIG. 17 is a view illustrating a current distribution in electrodes of the conventional capacitor.

As illustrated in FIG. 17, results of the simulation on the conventional capacitor show a tendency of the current distributions to concentrate in outer edge portions 12C between the tabs 12A of the plate electrodes 12. This may be because the lead wirings 37 do not overlap the plate electrodes 12 and thus the magnetic fields generated by the currents that flow through the lead wiring 37 and the plate electrodes 12 do not cancel each other. As a result, the current concentrates in the outer edge portions 12C of the plate electrodes 12.

The results of the simulation on the return-type capacitor show that the current flows inside the opposed portions 12B of the plate electrodes 12 along the opposed lead wiring 37. In the return-type capacitor, an increase in resistance due to concentration of the current flow in the plate electrodes 12 is reduced in comparison to the conventional capacitor. Therefore, a resistance component of the sheet capacitor 7 is kept low.

Figure 18:
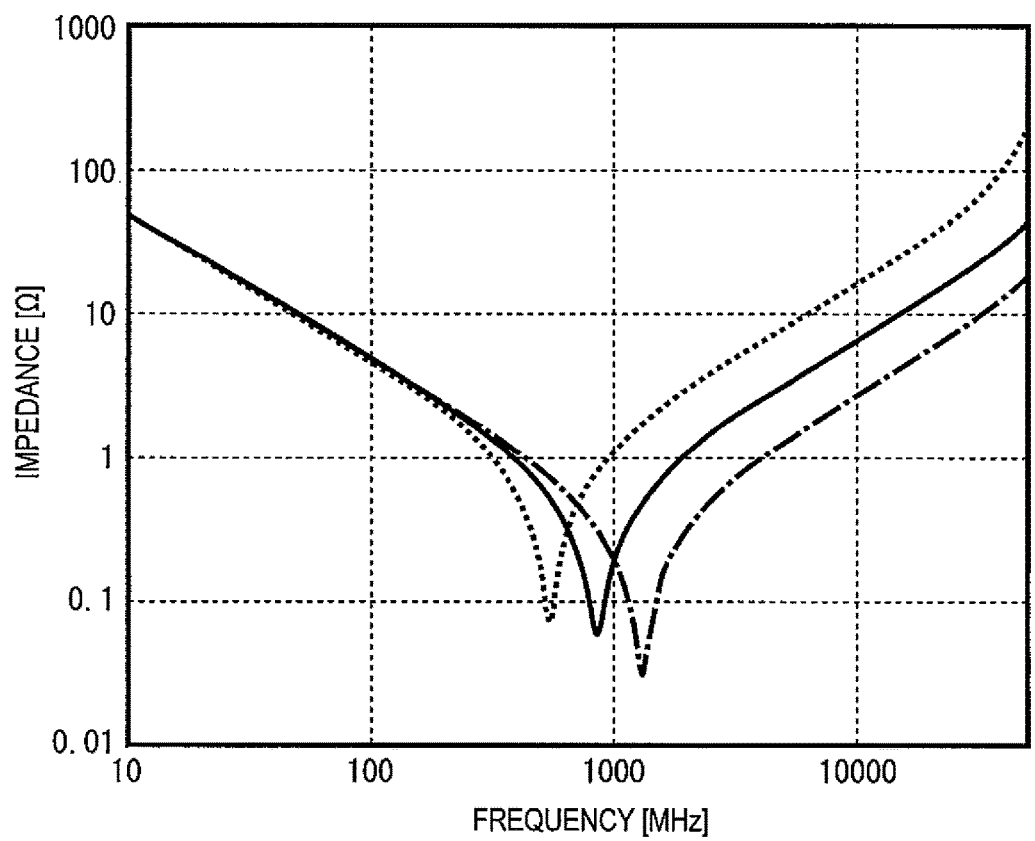
FIG. 18 is a graph illustrating impedance-frequency characteristics.

Impedance-frequency characteristics of the return-type capacitor and the conventional capacitor around resonant frequencies are illustrated in FIG. 18.

As illustrated in FIG. 18, the characteristics of the return-type capacitor indicated with a solid line show the resonant frequency higher than the resonant frequency of the conventional capacitor, the characteristics of which are indicated with a dotted line. Namely, the ESL of the sheet capacitor 7 is kept low. Furthermore, the characteristics of the return-type capacitor show that a frequency range in which the impedance is 1 ohm or lower is larger than that of the conventional sheet capacitor 7. Namely, the impedance of the sheet capacitor 7 at the resonant frequency indicating the ESR is also kept low.

In this embodiment, the lead wirings 37 are arranged so as to overlap the plate electrodes 12 of the sheet capacitors 7 in the stacking direction of the multi-layered circuit board 1. Therefore, the magnetic field generated by the current that flows through the lead wiring 37 and the magnetic field generated by the current that flows through the corresponding opposed portion 12B of the plate electrode 12 cancel each other. As a result, the ESL of the sheet capacitor 7 decreases.

In the sheet capacitor 7 in which the lead wiring 37 is connected to the tab 12A of the plate electrode 12, the current flows through the opposed portion 12B of the plate electrode 12. In comparison to the conventional capacitor in which the current concentrates in the outer edge portion 12C of the plate electrode 12, the ESR of the sheet capacitor 7 decreases.

The sheet capacitors 7 are located between the power supply terminals and the ground terminal of the LSI chip 2 and function as bypass capacitors. According to the configuration, the power supply impedance with respect to the LSI chip 2 can be reduced and thus the LSI chip 2 operates at a high speed.

The chip connecting pads 5 connected to the LSI chip 2 are arrange so as to overlap the plate electrodes 12 of the sheet capacitors 7 in the stacking direction of the multi-layered circuit board 1. According to the configuration, entire areas of the lead wiring 37 overlap the plate electrodes 12 and thus increases in ESL of the sheet capacitors 7 due to the lead wiring 37 can be suppressed.

According to the configuration, because increases in ESL of the sheet capacitor 7 due to the lead wiring 37 can be suppressed, the following effects can be achieved.

The following problem may occur when an LSI chip is connected to a package or a printed circuit board for the LSI chip. A parasitic capacitance in the LSI chip and an inductance of the package or the printed circuit board for the LSI chip cause parallel resonance in a frequency range from 40 MHz to 200 MHz. This results in variation in power supply voltage. To address this problem, the parasitic capacitance in the LSI chip may be adjusted to control the resonant frequency. Through the control of the resonant frequency, noise is reduced and the variation in power supply voltage is suppressed. However, including a capacitor having a proper parasitic capacitance in the LSI chip causes an increase in size of the LSI chip, which results in an increase in cost.

This embodiment includes the sheet capacitor 7 having a low ESL. Therefore, in the frequency range described above, the sheet capacitor 7 is considered to be a capacitor included in the multi-layered circuit board 1, that is, the sheet capacitor 7 is considered to be a capacitor included in the LSI chip 2 although the sheet capacitor 7 is arranged outside the LSI chip 2. According to the configuration, the resonant frequency that may be a cause of noises can be controlled even through the LSI chip 2 does not include a capacitor having a relatively large area and thus the noises are suppressed.

In this embodiment, the plate electrodes 12 of the sheet capacitors 7 are connected to the lead wiring 37 and the chip connecting pads 5 on the upper surface of the board 1 and the external connection pads 3 on the lower surface of the board 1 via the interlayer connecting conductors 33 when including the sheet capacitors 7 in the multi-layered circuit board 1. Each interlayer connecting conductor 33 is formed by filling the large-diameter via 31 and the small-diameter via 32 having different inner diameters with plating metal. A diameter of the upper portion of the small-diameter via 32 is smaller than a diameter of the lower portion of the large-diameter via 31 and thus they form a step.

The upper surface of the plate electrode 12 of each sheet capacitor 7 includes a portion located at the bottom of the large-diameter via 31 and exposed as a surface at the bottom of the large-diameter via 31 and around the upper edge opening of the small-diameter via 32. When the large-diameter via 31 and the small-diameter via 32 are filled with the plating metal and the interlayer connecting conductor 33 is formed, the interlayer connecting conductor 33 is in surface contact with the portion of the upper surface of the plate electrode 12 at the bottom of the large-diameter via 31. According to the configuration, a sufficient contact area is achieved and thus a contact resistance is kept low.

Namely, in this embodiment, the contact resistance between the sheet capacitor 7 and the lead wiring 37 is kept low even through the sheet capacitor 7 is included in the multi-layered circuit board 1. Therefore, area efficiency in forming the sheet capacitor 7 in the multi-layered circuit board 1 improves while the inductance component of the sheet capacitor 7 is kept low.

<Second Embodiment>

A second embodiment of the present invention will be described with reference to FIG. 19. In the following description, components and portions having the same configuration to those of the first embodiment will be indicated by the same numerals and will not be described for simplification of illustration.

Figure 19:
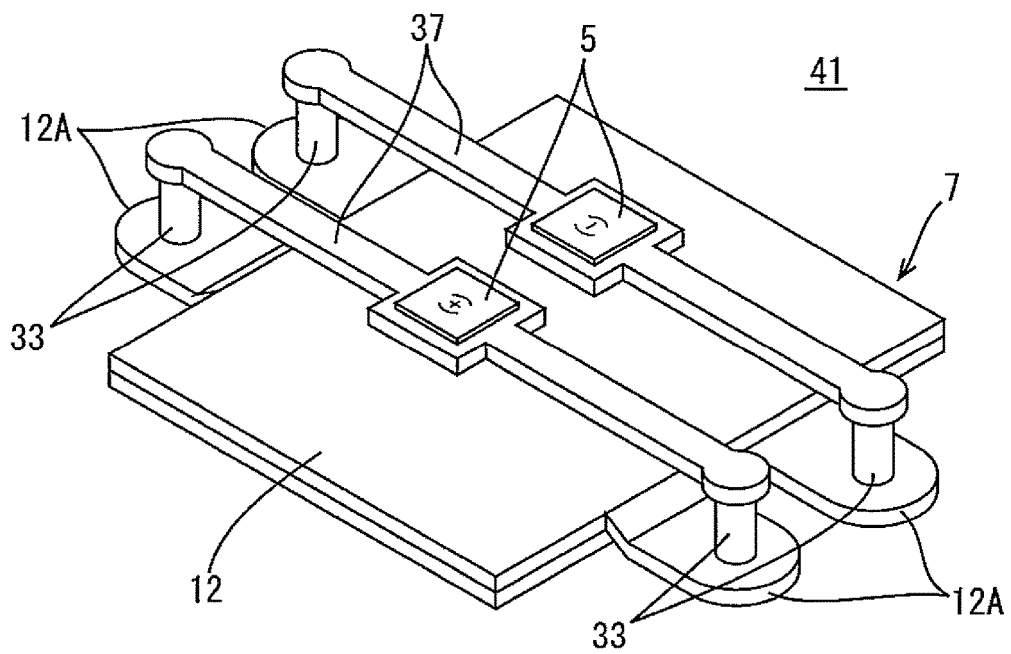
FIG. 19 is a perspective view of an opposed return-type capacitor.

As illustrated in FIG. 19, a multi-layered circuit board 41 according to this embodiment includes plate electrodes 12 with tabs 12A at opposite edges included in the sheet capacitors 7. The interlayer connecting conductors 33 and the lead wiring 37 are formed on the tabs 12A, respectively, and connected to the corresponding chip connecting pad 5.

Each lead wiring 37 connected to each tab 12 is arranged so as to overlap the plate electrodes 12 of the sheet capacitors 7, when viewed from the stacking direction of the multi-layered circuit board 41. The chip connecting pad 5 is formed on common portion of the lead wirings 37 connected to the corresponding plate electrode 12. Namely, the multi-layered circuit board 41 includes the opposed return-type capacitor with which current paths in which currents flow back and forth are oppositely provided.

According to the opposed return-type capacitor, a current flowing from each chip connecting pad 5 to the sheet capacitor 7 is distributed to the multiple lead wiring 37 for each plate electrode 12. In comparison to a return-type capacitor configured such that a current flows into a single lead wiring 37 for each plate electrode 12, an increase in resistance component caused by concentration of current that flows in the plate electrode 12 is suppressed.

As illustrated with a chain line in FIG. 18, the opposed return-type capacitor has a frequency range wider than that of the return-type capacitor illustrated with the solid line at an impedance equal to or lower than 1 ohm. Furthermore, the impedance of the opposed return-type capacitor is lower at the resonant frequency, that is, the ESR of the sheet capacitor 7 is kept low.

In this embodiment, currents flow from multiple portions into each plate electrode 12. In comparison to a configuration in which a current flows from one portion, the ESR of the sheet capacitor decreases.

<Third Embodiment>

A third embodiment of the present invention will be described with reference to FIGS. 20 to 23. In the following description, components and portions having the same configuration to those of the first embodiment will be indicated by the same numerals and will not be described for simplification of illustration. A difference between the first embodiment and the third embodiment is a configuration for forming each current path in which a current flows back and forth, that is, a configuration of each return-type capacitor.

Figure 20:
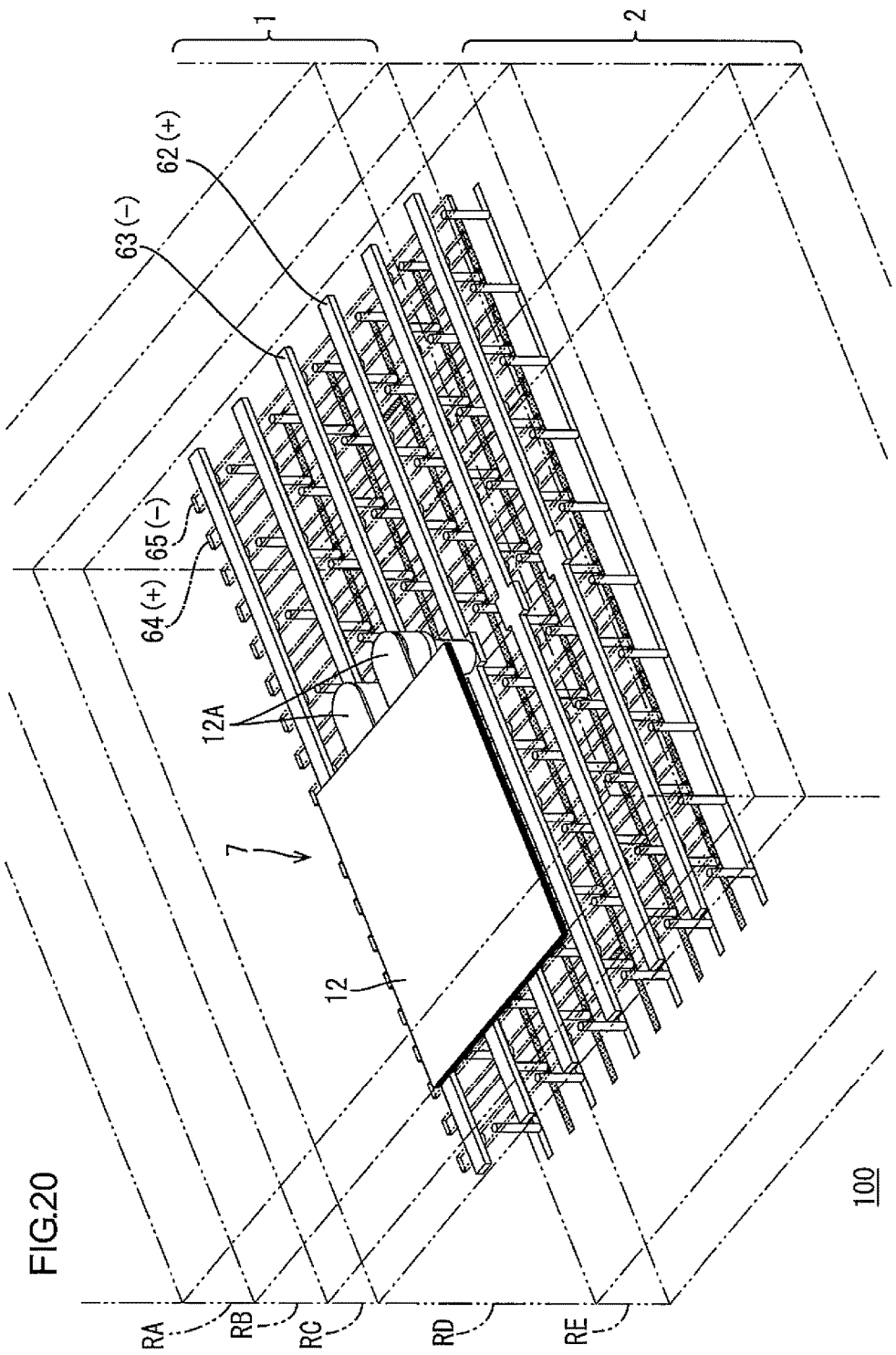
FIG. 20 is a perspective view of a portion of an LSI package according to a third embodiment.

As illustrated in FIG. 20, an LSI package (an example of a semiconductor device) 100 includes a multi-layered circuit board (an example of a circuit board) 1 and an LSI (an example of a semiconductor chip) 2. The LSI package 100 includes the return-type capacitors different from the return-type capacitors in the LSI package of the first embodiment illustrated in FIG. 1. Other configurations of the LSI package 100 are the same as those of the LSI package of the first embodiment.

The top and the bottom of FIG. 20 are inverted from those of FIG. 1. In FIG. 20, two-dot chain lines indicate regions (or layers) RA, RB, RC, RD, and RE. In the region RA of the multi-layered circuit board 1, the sheet capacitor 7 is formed. In the region RB, the LSI 2 and the multi-layered circuit board 1 are connected. In the region RC of the LSI 2, power supply wirings (62, 63) and transistors are formed. The region RD is a bulk region of the LSI 2. The region RE is a protective molding region of the LSI 2.

Figure 21:
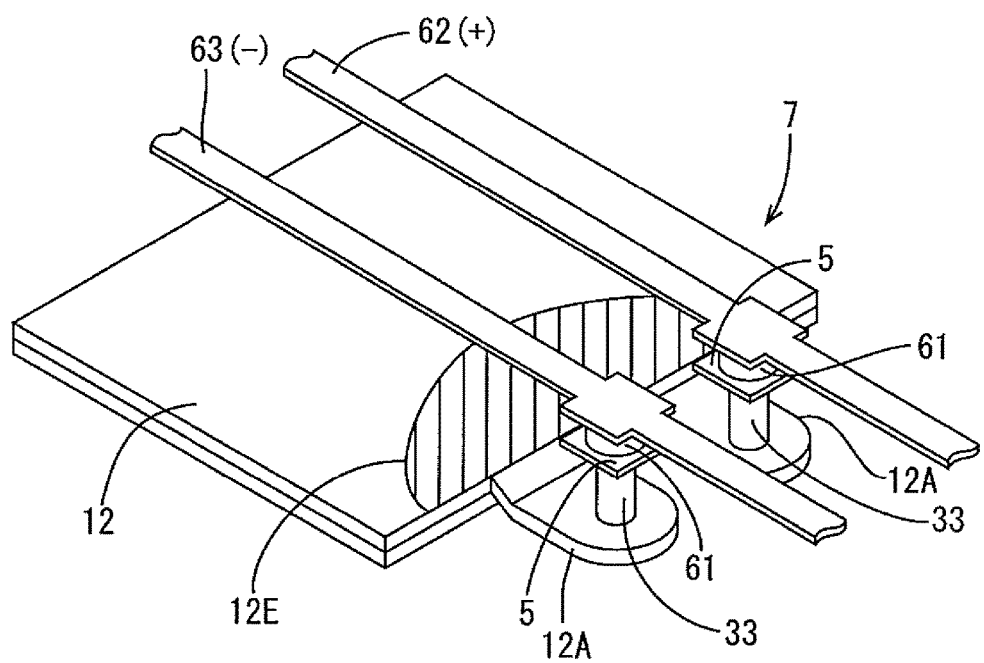
FIG. 21 is a perspective view of a return-type capacitor according to the third embodiment.
Figure 22:
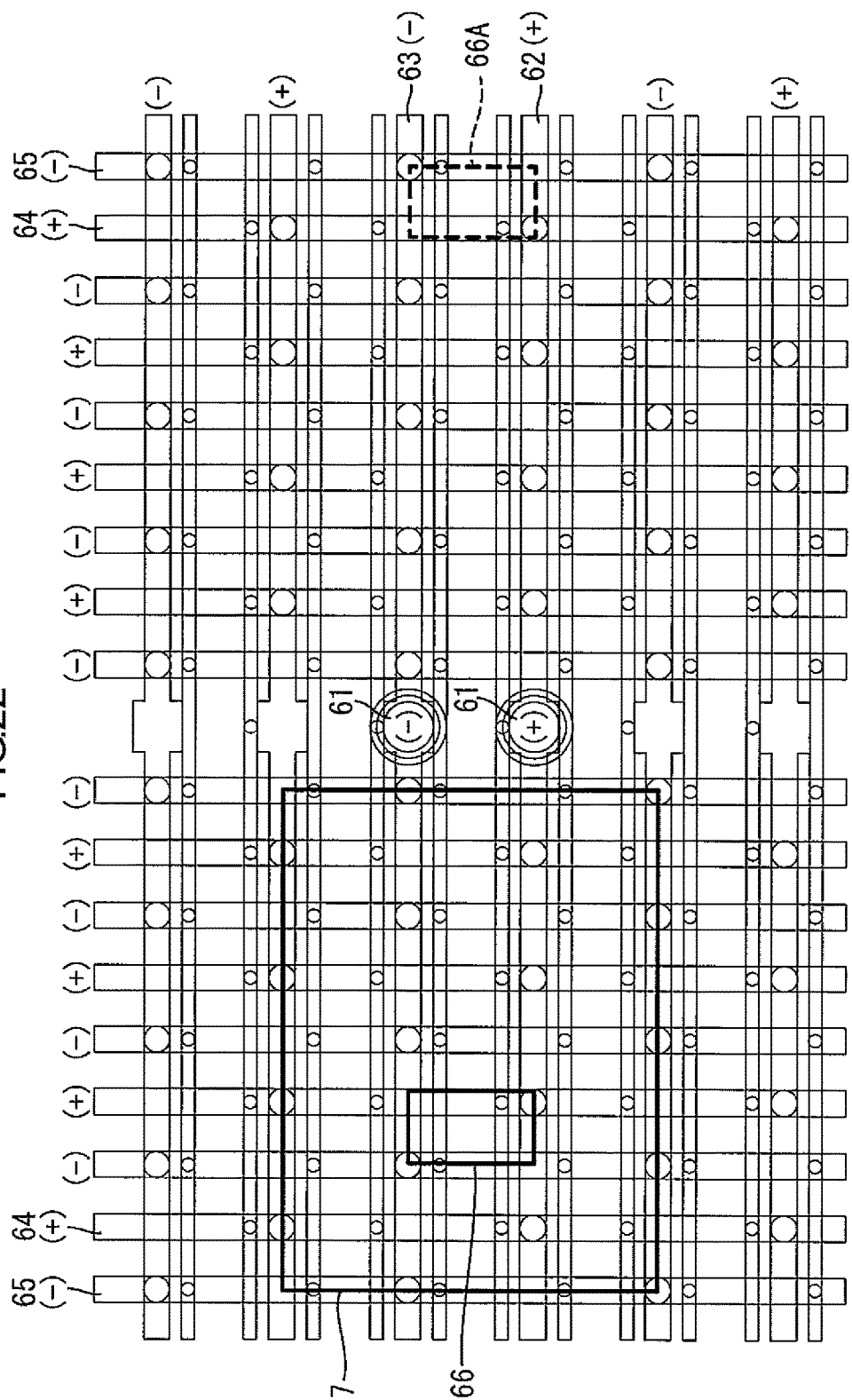
FIG. 22 is a plan view illustrating arrangement of power supply wiring patterns, a circuit region of an LSI and a sheet capacitor.

As illustrated in FIGS. 20 and 22, power supply wirings (62, 63, 64, 65) of the LSI 2 are formed in different layers and in a mesh-like. Power supply (+) wirings 62 and ground (−) wirings 63 are perpendicular to power supply (+) wirings 64 and ground (−) wirings 65. As illustrated in FIGS. 21 and 22, the power supply wiring 62 and the ground wiring 63 are arranged so as to overlap a pair of the plate electrodes 12 of the sheet capacitor 7, when viewed from a stacking direction of the dielectric layer 11 and the pair of the plate electrodes 12 of the sheet capacitor 7. In other words, the pair of the plate electrodes 12 of the sheet capacitor 7 is arranged so as to overlap the pair of the power supply wirings (62, 63) of the LSI 2 when viewed from the stacking direction of the dielectric layer 11 and the pair of the plate electrodes 12.

The power supply wiring 62 that overlaps the plate electrodes 12 is connected to one of the plate electrodes 12 of the sheet capacitor 7 via an LSI electrode pad 61, the chip connecting pad 5, the interlayer connecting conductor 33, and the tab 12A. The ground wiring 63 that overlaps the plate electrodes 12 is connected to the other one of the plate electrodes 12 of the sheet capacitor 7 via an LSI electrode pad 61, the chip connecting pad 5, the interlayer connecting conductor 33, and the tab 12A.

As illustrated in FIG. 22, the LSI 2 includes a circuit region (66: an example of a heat generating region) in which heat is generated during operation after power is supplied via the power supply wirings (62, 63) and the operation is started. The circuit region 66 is located at a position that overlaps the pair of the plate electrodes (12) when viewed from the stacking direction. The circuit region 66 is a region in which a CPU is formed, for example.

As illustrated in FIG. 21, in the third embodiment, the power supply wiring 62 or the ground wiring 63 in the LSI 2, the LSI electrode pads 61, the chip connecting pads 5, the interlayer connecting conductors 33, the tabs 12A, and the sheet capacitor 7 form a current path in which a current flows back and forth, and a return-type capacitor is formed with the current path.

Similar to the current path of the first embodiment illustrated in FIG. 14, in the return-type capacitor 7 of the third embodiment, the power supply wiring 62 and the ground wiring 63 are arranged so as to overlap the plate electrodes 12 of the sheet capacitor 7 via an insulating layer that is very thin, when viewed from the stacking direction of the multi-layered circuit board 1. Therefore, magnetic fields generated by the currents that flow through the power supply wiring 62 and the ground wiring 63 affect current distributions of opposed portions 12E of the plate electrodes 12 opposed to the power supply wiring 62 and the ground wiring 63.

Because the currents flow in and out of the plate electrodes 12 via the tabs 12A, the current distributions from the tabs 12A to middle portions of the plate electrodes 12 are present. Directions in which the currents flow are opposite to directions in which the currents flow in the power supply wiring 62 and the ground wiring 63 that are opposed to the plate electrodes 12.

As a result, similar to the first embodiment, the magnetic field generated by the current that flows in the power supply wiring 62 or the ground wiring 63 and the magnetic field generated by the current that flows in the plate electrode 12 cancel each other and the self-inductance that is defined based on an intensity of the magnetic field decreases. Furthermore, similar to the first embodiment, in the return-type capacitor, an inverted current distribution at the opposed portion 12E of the plate electrode 12 relative to that of the power supply wiring 62 or the ground wiring 63 that is opposed to the plate electrode 12 increases.

Figure 23:
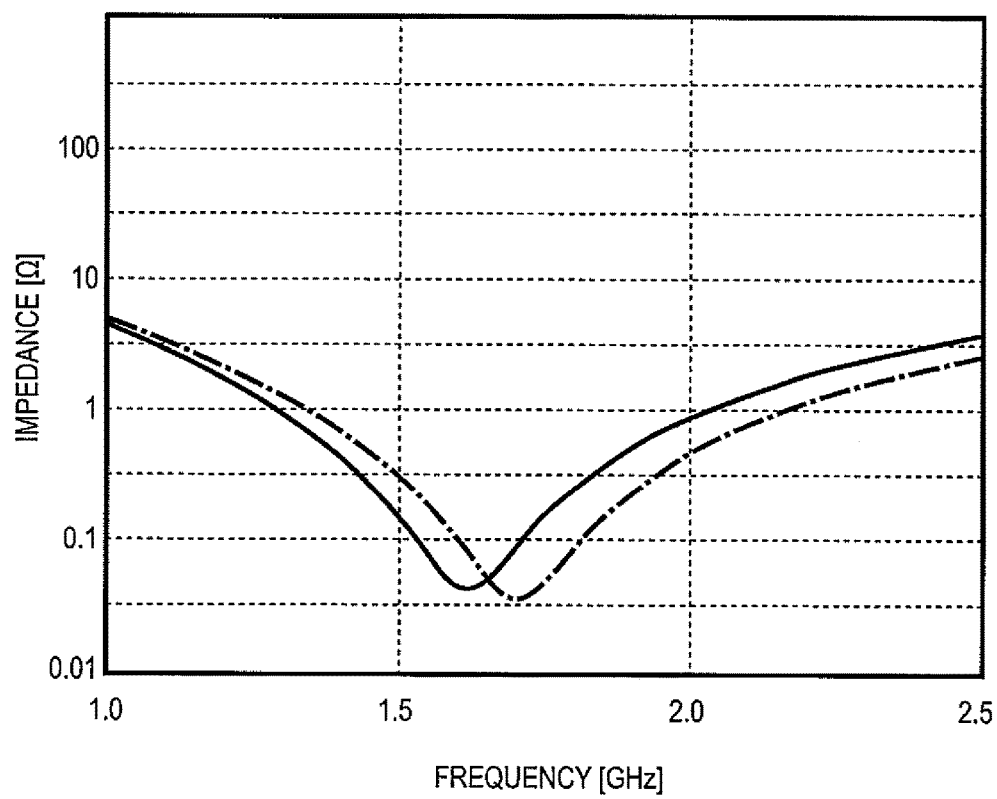
FIG. 23 is a graph illustrating impedance-frequency characteristics according to the third embodiment.

Results of simulations of frequency-impedance characteristics of the return-type capacitor 7 in the third embodiment around a resonant frequency are illustrated in FIG. 23. In FIG. 23, a solid line illustrates the result of the simulation in which a circuit region 66A is located at a position that does not overlap the pair of the plate electrodes 12 viewed from the stacking direction. A chain line illustrates the result of the simulation in which the circuit region 66 is located at the position that overlaps the pair of the plate electrodes 12 viewed from the stacking direction.

Through the simulations, it is confirmed that the resonant frequency of the circuit region 66 that is located at the position that overlaps the pair of the plate electrodes 12 viewed from the stacking direction increases 6.3% in comparison to the circuit region 66A and the inductance decreases about 13%. Namely, setting the circuit region 66, which is a source of noise, closer to the return-type capacitor 7 is more advantageous to reduce the ESL and the ESR of the sheet capacitor.

In the third embodiment, the pair of the plate electrodes 12 of the return-type capacitor 7 is arranged so as to overlap the pair of the power supply wirings (62, 63) of the LSI 2 viewed from the stacking direction of the dielectric film (layer) 11 and the pair of the plate electrodes 12. According to the configuration of the return-type capacitor 7, similar to the first embodiment, the ESL and the ESR of the sheet capacitor 7 relative to the circuit region (the heat generating region) 66 can be reduced.

In the third embodiment, the circuit region 66 is located at the position that overlaps the pair of the plate electrodes 12 viewed from the stacking direction. According to the configuration, almost all power supply wirings that extend to the circuit region 66 are opposed to the sheet capacitor 7. In comparison to the configuration in which the circuit region is not located at the position that overlap the pair of the plate electrodes 12 such as the circuit region 66A, the ESL of the sheet capacitor 7 relative to the circuit region 66 can be further reduced. As a result, the noises generated in the circuit region 66 can be further reduced.

It is preferable for setting the circuit region 66 to a region of the LSI 2 in which heat at the highest temperature is produced such as a region that includes a CPU. Namely, the region in which the heat at the highest temperature is produced is a region in which switching of transistors included in the LSI 2 actively occurs at high intensity and thus high power consumption occurs. In such a region, noises are most likely to occur. Therefore, noise reduction effect by the sheet capacitor is highly expected.

<Other Embodiments>

The technology is not limited to the above embodiments described in the above description and the drawings. For example, the following embodiments may be included in technical scopes of the present invention.

Figure 24:
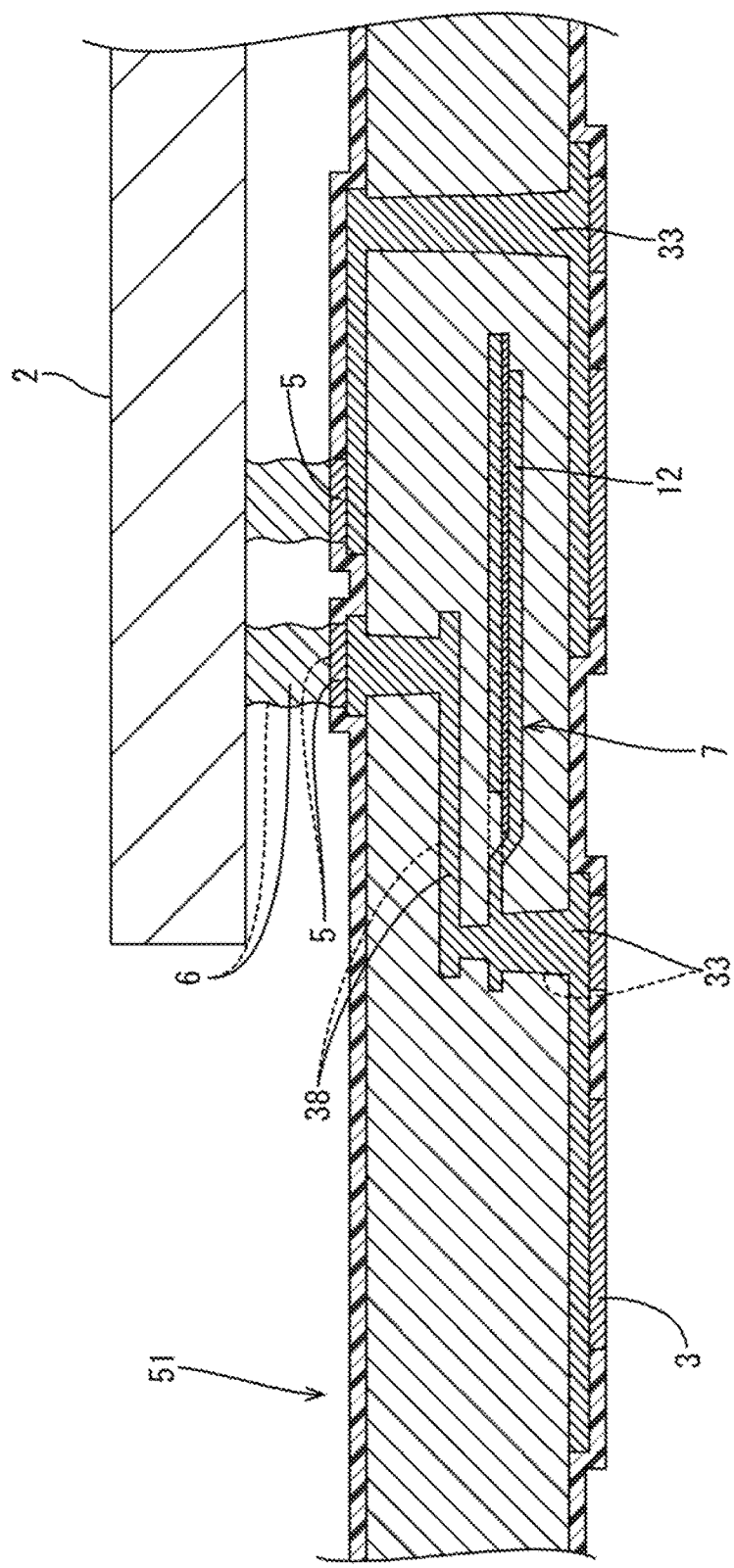
FIG. 24 is a cross-sectional view of an LSI package including a multi-layered circuit board according to another embodiment.

(1) In the first and the second embodiments, the lead wiring 37 are formed from the copper foils 23 laid on the lower surfaces of the multi-layered circuit boards 1 and 41, respectively. However, the lead wiring 37 may be formed from internal wirings in the multi-layered circuit boards 1 and 41. A multi-layered circuit board 51 illustrated in FIG. 24 includes internal wirings 38 that are components different from the sheet capacitors 7. Each of the internal wirings 38 is arranged so as to overlap the corresponding plate electrode 12 of the corresponding sheet capacitor 7 when viewed from the stacking direction of the multi-layered circuit board 51. According to the configuration, the ESL of the sheet capacitor 7 can be reduced in the manner similar to the first and the second embodiments.

(2) In the first and the second embodiments, the lead wirings 37 connected to the respective plate electrodes 12 are disposed on the lower surfaces of the multi-layered circuit boards 1 and 41, respectively. However, the lead wiring 37 may be also disposed on the upper surfaces of the multi-layered circuit boards 1 and 41, respectively. Alternatively, the lead wirings 37 that are connected to the plate electrodes 12 closer to the upper surfaces of the circuit boards among the plate electrodes 12 of the sheet capacitors 7 may be disposed on the upper surfaces of the multi-layered circuit boards and the lead wiring 37 that are connected to the plate electrodes closer to the lower surfaces of the circuit boards may be disposed on the lower surfaces of the multi-layered circuit boards. According to the configurations, magnetic fields generated by currents that flow through the respective lead wiring 37 more strongly affect the opposed portions 12B of the respective plate electrodes 12.

(3) In the first and the second embodiments, the interlayer connecting conductors 33 connected to the respective plate electrodes 12 are connected to the tabs 12A of the plate electrodes 12. The interlayer connecting conductors 33 may be connected to the meddle portions of the plate electrodes 12.

(4) In each of the first and the second embodiments, one stage of the sheet capacitor 7 is formed in the multi-layered circuit board 1 or 41 when viewed from the stacking direction of the multi-layered circuit board 1 or 41. A plurality of stages of the sheet capacitors 7 may be formed in the multi-layered circuit board 1 or 41. In this configuration, the vias 31 that are formed in the portions of the multi-layered circuit board closer to the upper surface and the lower surface of the multi-layered circuit board have steps relative to the plate electrodes 12 of the plurality of stages of the sheet capacitors 7. According to the configuration, even though the plurality of stages of the sheet capacitors 7 are formed in the stacking direction of the multi-layered circuit board, the contact resistance between each sheet capacitor 7 and the lead wiring 37 or other components is kept low and thus the inductance of each sheet capacitor 7 is kept low.

(5) In the first embodiment, the tabs 12A of the plate electrodes 12 are arranged at the same side of the corresponding plate electrode 12. The tabs 12A may be arranged at opposite sides of the corresponding plate electrode 12 or different sides of the corresponding plate electrode 12.

(6) The holes for forming the interlayer connecting conductors 33 in the first and the second embodiments are formed through multiple steps with laser beam application. The holes may be formed in a single step by drilling or other methods.

(7) The interlayer connecting conductors 33 in the first and the second embodiments are formed by plating. The interlayer connecting conductors 33 may be formed by filling the large-diameter via and the small-diameter via with conductive materials by printing.

(8) In the third embodiment, the sheet capacitors 7 are formed inside the multi-layered circuit board 1. The sheet capacitors may be formed on the side of the LSI 2. In this configuration, the sheet capacitors may be formed on the surfaces connected to the multi-layered circuit board 1 via thin insulating film. Namely, it is preferable that the plate electrodes of the sheet capacitors and the power supply wirings (62, 63) of the LSI 2 are adjacent to each other.

EXPLANATION OF SYMBOLS

1, 41, 51: multi-layered circuit board
5: chip connecting pad
7: sheet capacitor
12: plate electrode
12A: tab
12B: opposed portion
12C: outer edge portion
20, 21: prepreg sheet
33: interlayer connecting conductor
37: lead wiring
38: internal wiring
62: power supply wiring
63: ground wiring
66: circuit region
100: LSI package

The invention claimed is:

1. A multi-layered circuit board comprising:
a first insulating layer;
a second insulating layer;
a sheet capacitor disposed between the first insulating layer and the second insulating layer, the sheet capacitor comprising a pair of electrodes each having a tab and a dielectric sandwiched between the electrodes; and
lead wirings connected to the tabs of the electrodes, respectively, and disposed on an opposite side of the first or the second insulating layer with respect to the sheet capacitor to overlap the electrodes when viewed from a stacking direction of the multi-layered circuit board,
wherein the tabs are formed at outer edges of the electrodes and outwardly project from opposed portions of the respective electrodes opposed to the dielectric in a direction along a plate surface of the multi-layered circuit board.

2. The multi-layered circuit board according to claim 1, wherein
the lead wirings continue to board-side connecting pads, respectively, and
the board-side connecting pads are formed on one of surfaces of the multi-layered circuit board, connected to chip-side connecting pads in a power supply system of a semiconductor chip on the multi-layered circuit board, and disposed to overlap the electrodes when viewed from the stacking direction of the multi-layered circuit board.

3. The multi-layered circuit board according to claim 2, wherein
each of the lead wirings continues from the corresponding board-side connecting pad to a different portion of the corresponding electrode.

4. A semiconductor device comprising:
a circuit board;
a semiconductor chip mounted on the circuit board using a flip chip technology, the semiconductor chip comprising:
a heat generating region in which heat is generated when power is supplied to the heat generating region; and
a pair of power supply wirings for supplying power to the heat generating region; and
a sheet capacitor comprising a pair of plate electrodes each having a tab and a dielectric film sandwiched between the plate electrodes, the sheet capacitor being included in the circuit board or the semiconductor chip, wherein
the tabs are formed at outer edges of the plate electrodes and outwardly project from opposed portions of the respective plate electrodes opposed to the dielectric film in a direction along a plate surface of the circuit board,
lead wirings are connected to the tabs of the plate electrodes, respectively, and
the plate electrodes are disposed to overlap the pair of the power supply wirings of the semiconductor chip when viewed from a stacking direction in which the dielectric film and the pair of the plate electrodes are stacked.

5. The semiconductor device according to claim 4, wherein the heat generating region is located at a position that overlaps the pair of the plate electrodes when viewed from the stacking direction.

6. The semiconductor device according to claim 4, wherein the heat generating region is a region in which heat is generated at a highest temperature in the semiconductor chip.

* * * * *